United States Patent
Takai

(10) Patent No.: US 8,258,608 B2
(45) Date of Patent: Sep. 4, 2012

(54) LEAD FRAME AND INTERMEDIATE PRODUCT OF SEMICONDUCTOR DEVICE

(75) Inventor: Keiji Takai, Kitakyushu (JP)

(73) Assignee: Mitsui High-Tec, Inc., Fukuoka (JP)

( * ) Notice: Subject to any disclaimer, the term of this patent is extended or adjusted under 35 U.S.C. 154(b) by 156 days.

(21) Appl. No.: 12/911,212

(22) Filed: Oct. 25, 2010

(65) Prior Publication Data
US 2011/0095405 A1 Apr. 28, 2011

(30) Foreign Application Priority Data
Oct. 26, 2009 (JP) ................................. 2009-245603

(51) Int. Cl.
*H01L 21/02* (2006.01)
(52) U.S. Cl. ........ 257/669; 257/676; 257/690; 257/738; 257/E21.499; 257/E21.506; 257/E23.036; 257/E23.141; 257/E23.177; 257/E33.056; 257/E33.077
(58) Field of Classification Search .................... 257/81, 257/738.784, E21.499–506, 511, 705, 23.036, 257/37, 55, 141, 177, 33.056, 669, 690
See application file for complete search history.

(56) References Cited

U.S. PATENT DOCUMENTS

| | | | | |
|---|---|---|---|---|
| 4,048,438 A * | 9/1977 | Zimmerman | ................. | 174/254 |
| 5,159,434 A * | 10/1992 | Kohno et al. | ................. | 257/676 |
| 5,438,478 A * | 8/1995 | Kondo et al. | ................. | 361/704 |
| 5,661,086 A * | 8/1997 | Nakashima et al. | ........... | 257/668 |
| 5,920,116 A * | 7/1999 | Umehara et al. | ............. | 257/669 |
| 6,507,114 B2 * | 1/2003 | Hui et al. | ..................... | 257/738 |
| 6,545,364 B2 * | 4/2003 | Sakamoto et al. | ............ | 257/773 |
| 6,727,114 B2 * | 4/2004 | Wada et al. | ................... | 438/106 |
| 6,870,244 B2 * | 3/2005 | Yamashita et al. | ............ | 257/668 |
| 7,176,487 B2 * | 2/2007 | Sakamoto et al. | ............. | 257/48 |
| 7,193,320 B2 * | 3/2007 | Hosoyamada et al. | ....... | 257/738 |
| 7,220,921 B1 * | 5/2007 | Sakamoto et al. | ............ | 174/261 |
| 7,327,017 B2 * | 2/2008 | Sirinorakul et al. | ........... | 257/666 |
| 7,476,972 B2 * | 1/2009 | Takahashi | ..................... | 257/773 |
| 7,605,475 B2 * | 10/2009 | Ochiai | .......................... | 257/774 |
| 7,705,443 B2 * | 4/2010 | Yokomae et al. | ............. | 257/690 |

(Continued)

FOREIGN PATENT DOCUMENTS
JP 2001-24135 1/2001

*Primary Examiner* — Michael Lebentritt
(74) *Attorney, Agent, or Firm* — Greenblum & Bernstein, P.L.C.

(57) ABSTRACT

In a lead frame used for manufacturing a semiconductor device by forming a circuit pattern group including unit lead frames having plural upper side terminal parts in the periphery of a semiconductor element mounting region in one line or plural lines and an outer frame surrounding the circuit pattern group in a state of having a gap in a lead frame material and then mounting a semiconductor element every the unit lead frame and carrying out necessary wiring and enclosing the entire surface of the circuit pattern group in which the semiconductor element is mounted and a part of the outer frame with a resin from an upper surface side and further etching from a lower surface side and forming lower side terminal parts joined to the upper side terminal parts of the circuit pattern group, the circuit pattern group and the outer frame are had and the inner edge of the outer frame is formed in an uneven portion in plan view and bonding between the resin and the outer frame is enhanced.

11 Claims, 7 Drawing Sheets

U.S. PATENT DOCUMENTS

| | | | |
|---|---|---|---|
| 7,868,451 B2* | 1/2011 | Muramatsu et al. | 257/723 |
| 8,008,758 B1* | 8/2011 | Kim et al. | 257/676 |
| 2008/0289853 A1* | 11/2008 | Sakai et al. | 174/126.2 |
| 2010/0078655 A1* | 4/2010 | Yang | 257/81 |
| 2011/0059577 A1* | 3/2011 | Etou et al. | 438/112 |
| 2011/0201159 A1* | 8/2011 | Mori et al. | 438/123 |

* cited by examiner

FIG. 5A
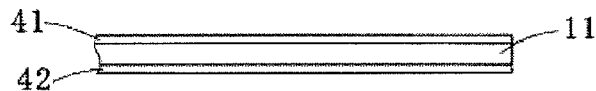
FIG. 5B
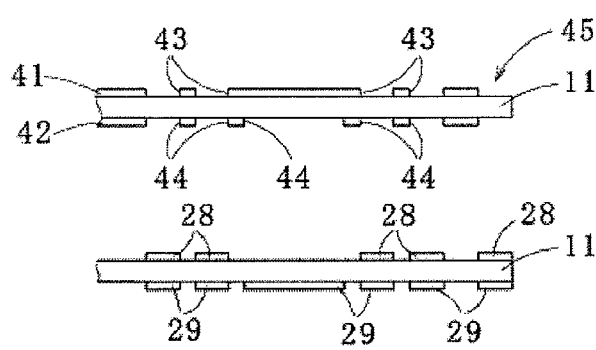
FIG. 5C
FIG. 5D
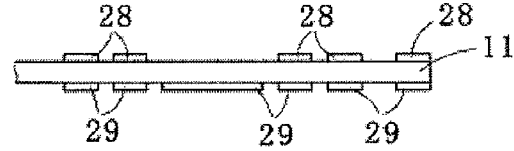
FIG. 5E
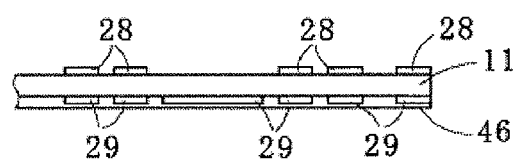
FIG. 5F
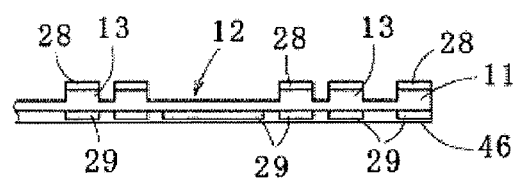
FIG. 5G
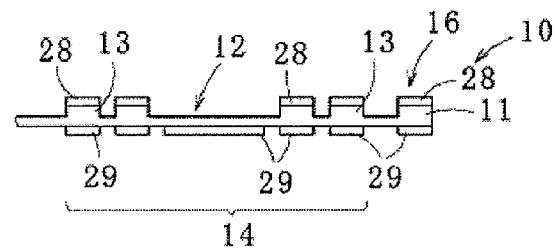

LEAD FRAME AND INTERMEDIATE PRODUCT OF SEMICONDUCTOR DEVICE

BACKGROUND OF THE INVENTION

1. Field of the Invention

The present invention relates to a lead frame used in manufacture of a semiconductor device, and an intermediate product of the semiconductor device using its lead frame.

2. Related Art

In manufacture of a semiconductor device, a reduction in manufacturing cost is desired, and a method for manufacturing the semiconductor device at low cost without using resin tape, adhesive tape, etc. is proposed in, for example, JP-A-2001-24135.

In the manufacturing method of the semiconductor device of JP-A-2001-24135, a noble metal plated layer is first formed on an external connection terminal part of a lower surface side, a portion or all of an outer frame and a wire bonding part of an upper surface side of a lead frame material, and half etching processing of the upper surface side of a lead frame material is performed. Next, after a semiconductor element is mounted, wire bonding is performed and the upper surface side is enclosed with a resin and then, etching processing of the lower surface side is performed and the external connection terminal part is projected and is made independent and the semiconductor device is manufactured.

However, in the manufacturing method of the semiconductor device of JP-A-2001-24135, the plated layer is formed on a surface of the outer frame as a resist film and the plated layer has bad properties of adhesion (properties of bonding) to a resin, so that there was a problem that the outer frame tends to peel from the resin. As a result of this, a defective piece of an intermediate product of the semiconductor device tends to occur and it was particularly necessary to be careful about handling of conveyance etc. of the intermediate product of the semiconductor device so that the outer frame does not peel from the resin.

SUMMARY OF THE INVENTION

The invention has been implemented in view of such circumstances, and an object of the invention is to provide a lead frame for preventing an outer frame from peeling from a resin, and an intermediate product of a semiconductor device.

A lead frame according to the invention along the object is the lead frame adapted for manufacturing a semiconductor device comprising: a lead frame material;

a circuit pattern group formed in the lead frame material including unit lead frames arrayed in one line or plural lines, each unit lead frame including a semiconductor element mounting region and plural upper side terminal parts formed in a periphery of the semiconductor element mounting region; and an outer frame formed in the lead frame material so as to surround said circuit pattern group with a gap, wherein an inner edge of the outer frame is provided with an uneven portion in plan view. As a result, bonding between the resin and the outer frame is enhanced.

The lead frame is used for mounting semiconductor elements in the unit lead frames, carrying out wiring on the unit lead frames and the semiconductor elements, enclosing the entire surface of the circuit pattern group in which the semiconductor elements are mounted and a part of the outer frame with a resin from an upper surface side, and etching from a lower surface side to form lower side terminal parts joined to the upper side terminal parts of the circuit pattern group.

In the lead frame according to the invention, the uneven portion formed in the outer frame preferably includes a T-shaped inner projection extended toward the circuit pattern group.

In the lead frame according to the invention, the uneven portion formed in the outer frame preferably includes a T-shaped recess formed toward the outside.

In the lead frame according to the invention, an inner corner of the outer frame preferably also has an uneven portion in plan view.

In the lead frame according to the invention, the uneven portion formed in the inner corner is preferably formed in a stepwise shape in plan view.

An intermediate product of a semiconductor device according to the invention along the object is the intermediate product of the semiconductor device comprising:

a lead frame material;

a circuit pattern group formed in the lead frame material including unit lead frames arrayed in one line or plural lines, each unit lead frame including a semiconductor element mounting region and plural upper side terminal parts formed in a periphery of the semiconductor element mounting region; and an outer frame formed in the lead frame material so as to surround said circuit pattern group with a gap, semiconductor elements mounted on the semiconductor element mounting regions and wired in the unit lead frames, a resin enclosing the entire surface of the circuit pattern group in which the semiconductor elements are mounted and a part of the outer frame on an upper surface side of the lead frame lead frame material, and lower side terminal parts formed by etching from a lower surface side of the lead frame material so as to be joined to the upper side terminal parts of the circuit pattern group, wherein an inner edge of the outer frame is formed in an uneven portion in plan view.

As a result, bonding between the resin and the outer frame is enhanced.

In the intermediate product of the semiconductor device according to the invention, the uneven portion formed in the outer frame preferably includes a T-shaped inner projection extended toward the circuit pattern group.

In the intermediate product of the semiconductor device according to the invention, the uneven portion formed in the outer frame preferably includes a T-shaped recess formed toward the outside.

In the intermediate product of the semiconductor device according to the invention, an inner corner of the outer frame preferably also has an uneven portion in plan view.

In the intermediate product of the semiconductor device according to the invention, the uneven portion formed in the inner corner is preferably formed in a stepwise shape in plan view.

In the lead frame according to the above aspects of the invention and the intermediate product of the semiconductor device according to the above aspects of the invention, since the inner edge of the outer frame is formed in the uneven portion in plan view, by a side surface of the uneven portion to which the lead frame material is exposed, an area of contact between the resin and the lead frame material increases and properties of adhesion between the resin and the outer frame improve, so that the intermediate product of the semiconductor device is prevented from peeling from the resin and handling of conveyance etc. of the intermediate product of the semiconductor device is facilitated and also occurrence of a defective piece of the intermediate product of the semiconductor device can be reduced.

BRIEF DESCRIPTION OF THE DRAWINGS

FIGS. 5A to 5G are explanatory diagrams of a manufacturing method of the lead frame according to one embodiment of the invention.

DETAILED DESCRIPTION OF THE PREFERRED EMBODIMENTS

Figure 1:
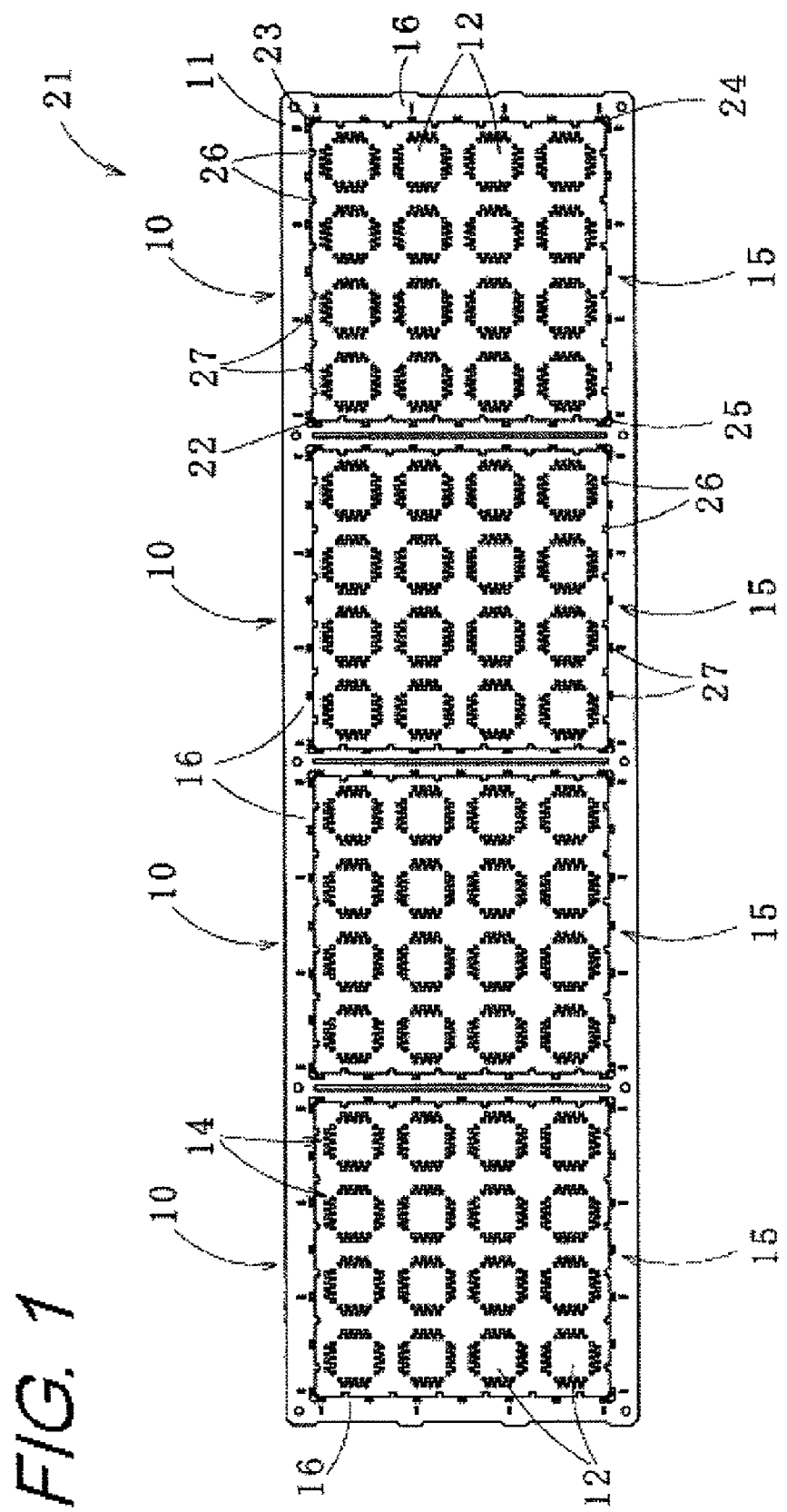
FIG. 1 is a plan view of a lead frame according to one embodiment of the invention.

Subsequently, an embodiment for embodying the invention will be described with reference to the accompanying drawings, and serves for understanding of the invention.

As shown in FIGS. 1, 2 and 6A to 6C, a lead frame 10 according to one embodiment of the invention is used for manufacturing a semiconductor device 20 by forming a circuit pattern group 15 including unit lead frames 14 having plural upper side terminal parts 13 in the periphery of a semiconductor element mounting region 12 in plural lines by the first etching and an outer frame 16 surrounding the circuit pattern group 15 in a state of having a gap in a lead frame material 11 made of copper or copper alloy and then mounting a semiconductor element 17 every the unit lead frame 14 and carrying out necessary wiring and further enclosing the entire surface of the circuit pattern group 15 in which the semiconductor element 17 is mounted and a part of the outer frame 16 with a resin 18 from an upper surface side and further performing the second etching from a lower surface side and forming lower side terminal parts 19 joined to the upper side terminal parts 13 of the circuit pattern group 15.

As shown in FIG. 1, the lead frame 10 has the circuit pattern group 15 formed during a step of manufacturing the semiconductor device 20 and formed by the first etching, and the outer frame 16 surrounding the circuit pattern group 15.

Then, a lead frame aggregate 21 having the plural (four in the embodiment) lead frames 10 arranged horizontally is formed.

Figure 2:
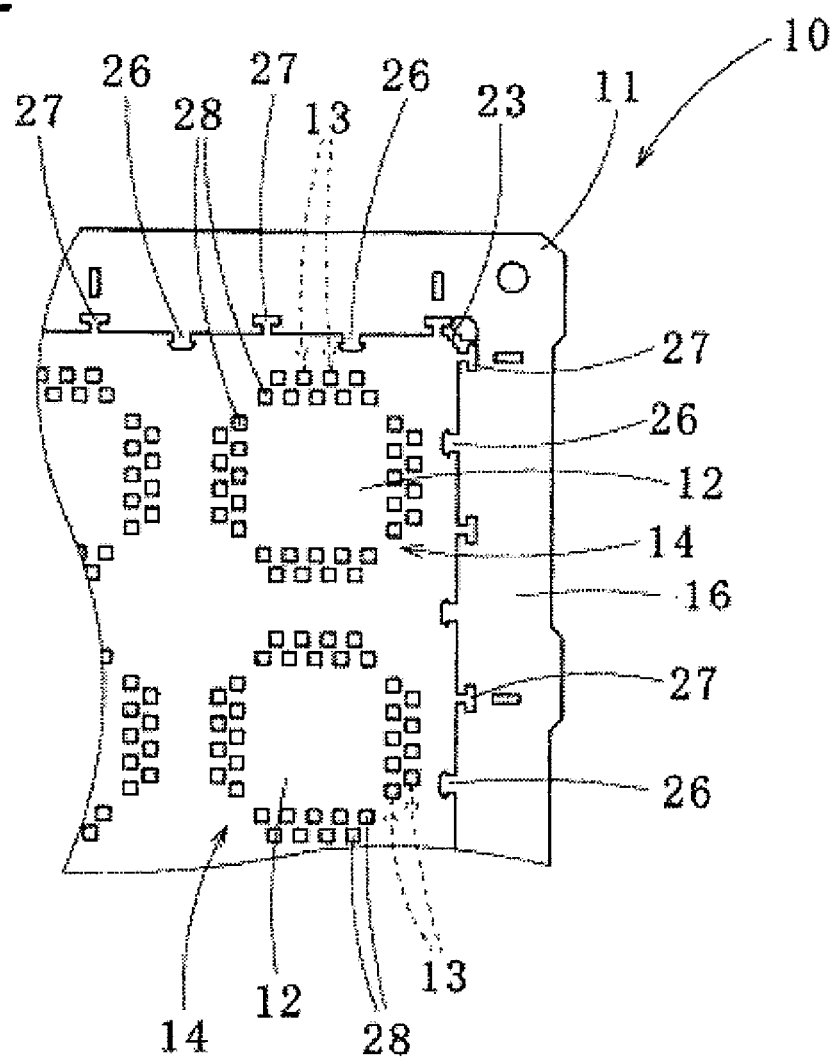
FIG. 2 is a partially enlarged plan view of the same lead frame.

The outer frame 16 is formed so as to surround the circuit pattern group 15 from four directions, and the inner edge of the outer frame 16 has an uneven portion in plan view, and stepwise inner corner regions 22 to 25 in plan view are respectively disposed in four inner corners (see FIG. 2).

Further, plural (six in the embodiment in the range of, for example, 3 to 15) T-shaped inner projections 26 extended toward the circuit pattern group 15 and plural (seven in the embodiment in the range of, for example, 3 to 15) T-shaped recesses 27 formed toward the outside are respectively disposed in an inside straight part (a region between the adjacent inner corner regions 22 to 25) of the outer frame 16.

By disposing the inner corner regions 22 to 25, the inner projections 26 and the recesses 27 thus, the inner edge of the outer frame 16 is formed in the uneven portion and a surface area of the exposed portion of the lead frame material 11 becomes wide, so that an area of contact between the resin 18 and the lead frame material 11 increases and adhesion properties improve.

The inner projection 26 can be formed in a state of forming a wide region of the T-shaped head in a horizontally long rectangle, but the right and left corners of the upper side (projection side) may be formed roundly as shown in the embodiment. In the recess 27, a wide region of the T-shaped head has a horizontally long rectangle in plan view in the embodiment (see FIG. 2).

The inner projections 26 and the recesses 27 are alternately formed and the inner edge of the outer frame 16 is formed in the uneven portion by the inner projections 26, the recesses 27 and the stepwise inner corner regions 22 to 25.

As shown in FIG. 5G, the outer frame 16 has the lead frame material 11 and plated layers 28, 29 respectively disposed on an upper surface and a lower surface of the lead frame material 11.

The plated layer 28 can be formed by giving Ni plating which is one example of foundation plating to the upper side surface of the lead frame material 11 and giving Pd plating on the Ni plating as noble metal plating and further giving Au plating on the Pd plating or can be formed by a two-layer structure in which Au plating is given on foundation Ni plating.

Also, the plated layer 29 can be formed by giving Ni plating which is one example of foundation plating to the lower side surface of the lead frame material 11 and giving Pd plating under the Ni plating and further giving Au plating under the Pd plating or can be formed by a one-layer structure of Ni plating or Sn plating, or can be formed by a two-layer structure in which Au plating is given under foundation Ni plating.

The circuit pattern group 15 includes plural (a total of 16 arranged in a 4 by 4 matrix in the embodiment) unit lead frames 14.

In the unit lead frame 14, a semiconductor element mounting region 12 for mounting a semiconductor element 17 is disposed in the center and plural upper side terminal parts 13 electrically connected to the semiconductor element 17 are arranged in the periphery of the semiconductor element mounting region 12.

The semiconductor element mounting region 12 is formed by the lead frame material 11 formed in substantially a half thickness by etching (for example, 30 to 55% of thickness is etched) and the plated layer 29 disposed on the lower surface of the lead frame material 11.

The upper side terminal parts 13 are formed by the lead frame material 11 projecting upward.

Also, the plated layers 28, 29 are respectively disposed on an upper surface and a lower surface of a region in which the upper side terminal parts 13 of the lead frame material 11 are formed (see FIG. 5G).

Figure 3:
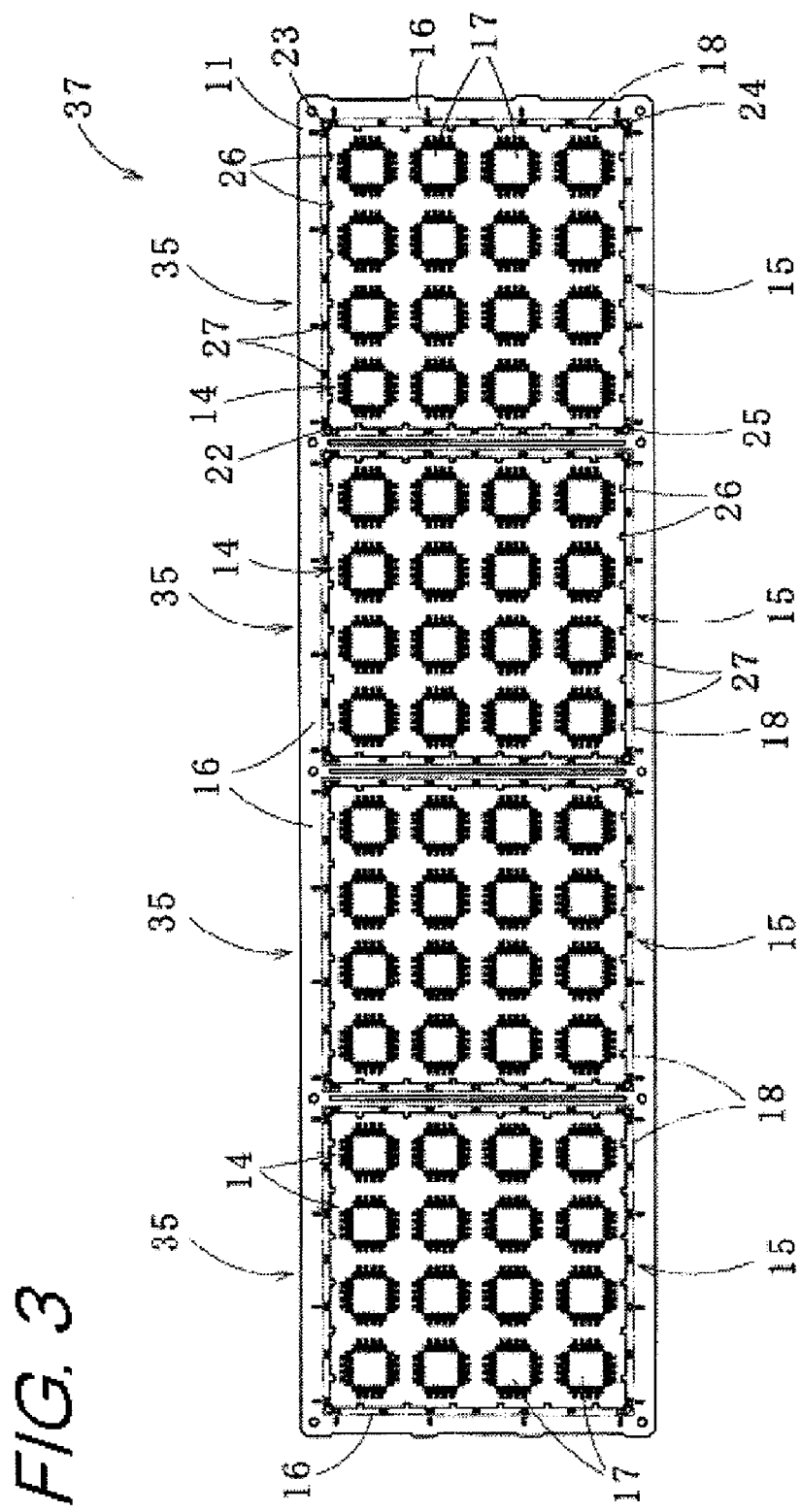
FIG. 3 is an explanatory diagram of an intermediate product of a semiconductor device according to one embodiment of the invention.
Figure 4A:
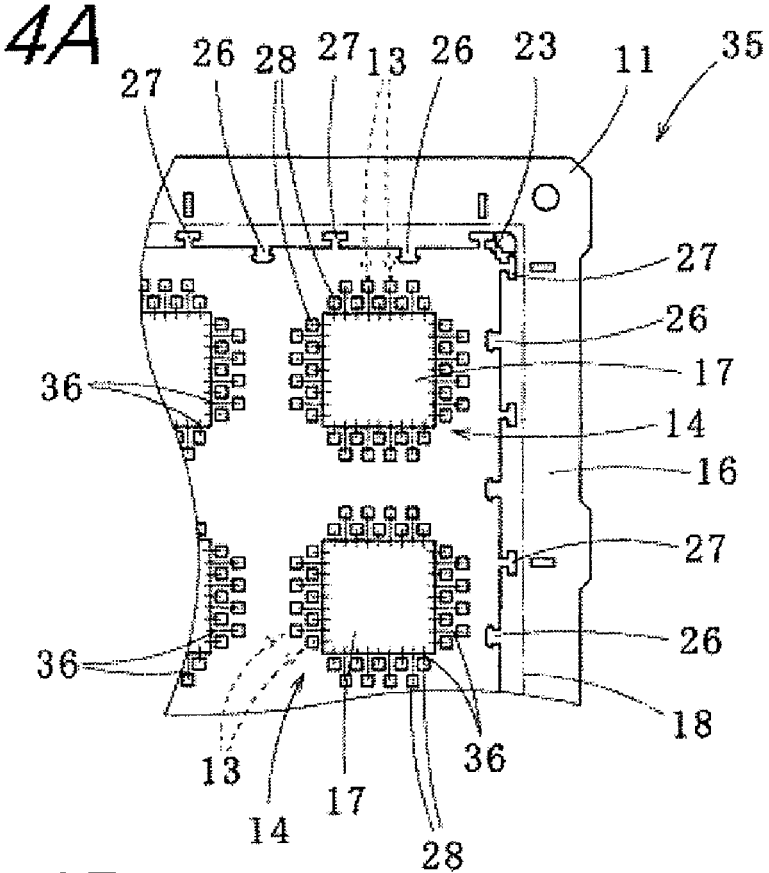
FIGS. 4A and 4B are partially enlarged plan views of the intermediate product of the same semiconductor device.
Figure 4B:
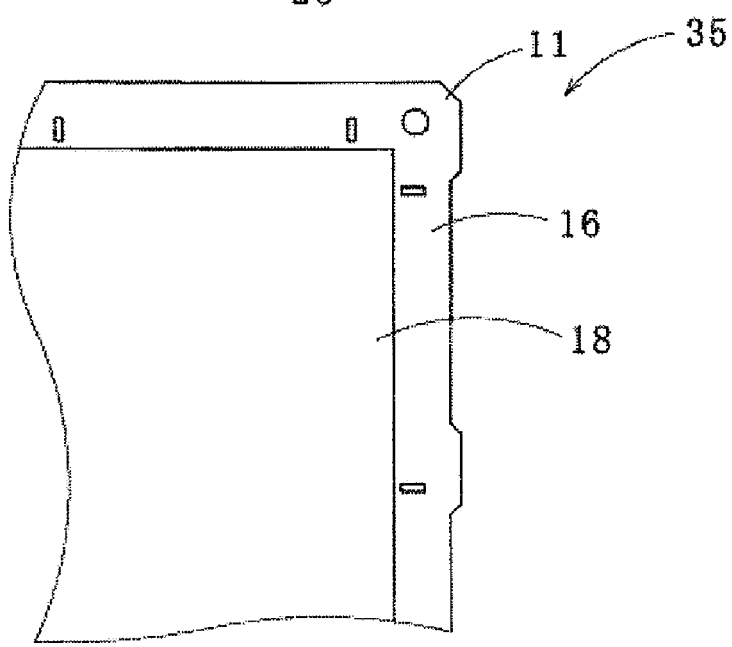

As shown in FIGS. 3, 4A and 4B, the lead frame 10 further goes through the manufacturing step of the semiconductor device 20 and thereby, an intermediate product 35 of the semiconductor device according to one embodiment of the invention is formed and has the circuit pattern group 15 in which the semiconductor element 17 is mounted in the semiconductor element mounting region 12 and the outer frame 16 arranged so as to surround its circuit pattern group 15. Also, in the intermediate product 35 of the semiconductor device, the entire surface of the circuit pattern group 15 in which the semiconductor element 17 is mounted and an inside region of the outer frame 16 are enclosed with the resin 18 from the upper side. In addition, the resin 18 is described by a two-dot chain line in FIGS. 3 and 4A.

Then, the semiconductor element 17 is electrically connected to the upper side terminal parts 13 through the plated layer 28 by bonding wires 36.

Here, it was shown by experiment that plating generally has low strength of bonding (adhesion) to a resin but the stepwise inner corner regions 22 to 25, the inner projections 26 and the recesses 27 are disposed and the inner edge of the outer frame 16 is formed in the uneven portion and thereby a surface area of the lead frame material 11 exposed to an inside side surface of the outer frame 16 becomes wide and an area of contact between the resin 18 and the lead frame material 11 is increased and properties of adhesion between the resin 18 and the outer frame 16 are enhanced and peeling of the outer frame 16 from the resin 18 can be suppressed.

Also, the plural (four in the embodiment) intermediate products 35 of the semiconductor device are coupled and an intermediate product aggregate 37 of the semiconductor device is formed.

Next, a manufacturing method of the semiconductor device 20 using the lead frame 10 will be described.

As shown in FIGS. 5A to 5C, resist films 41, 42 are respectively formed on an upper surface and a lower surface of the plate-shaped lead frame material 11, and exposure and development are performed and plural openings 43, 44 are respectively disposed in the resist films 41, 42 and also, portions of the resist films 41, 42 arranged on an upper surface and a lower surface of an outer frame formation region 45 are removed.

In addition, the opening 43 is disposed in a formation region of the upper side terminal parts 13 and the opening 44 is disposed in a formation region of the semiconductor element mounting region 12 and the lower side terminal parts 19 (lower side of the upper side terminal parts 13), respectively.

Next, as shown in FIG. 5D, the plated layers 28, 29 are respectively formed in the opening 43 and the upper surface of the outer frame formation region 45 and the opening 44 and the lower surface of the outer frame formation region 45. Here, the inside of the plated layer 28 disposed in the outer frame formation region 45 is formed in the uneven portion in plan view in order to form the inner corner regions 22 to 25, the inner projections 26 and the recesses 27.

As shown in FIGS. 5E and 5F, after a resist film 46 is formed on the lower surface of the lead frame material 11, the upper surface side of the lead frame material 11 is etched (the first etching) to substantially a half of the thickness of the lead frame material 11 using the plated layer 28 as an etching mask, and the upper side terminal parts 13 and the outer frame 16 are projected.

In addition, substantially a half of the thickness of the lead frame material 11 etched is in the range of for example, 30 to 55%, and this range results from, for example, a change in the plate thickness of the lead frame material 11 or an error of etching caused by an influence of an aspect ratio etc.

Then, as shown in FIG. 5G, the resist film 46 is removed from the lead frame material 11, and the lead frame 10 in which the outer frame 16 and the circuit pattern group 15 including 16 unit lead frames 14 are disposed is formed together with formation of the unit lead frames 14.

Consequently, the recesses 27, the inner projections 26 and the inner corner regions 22 to 25 having a side surface to which the lead frame material 11 is exposed are formed in the outer frame 16.

Figure 6A:
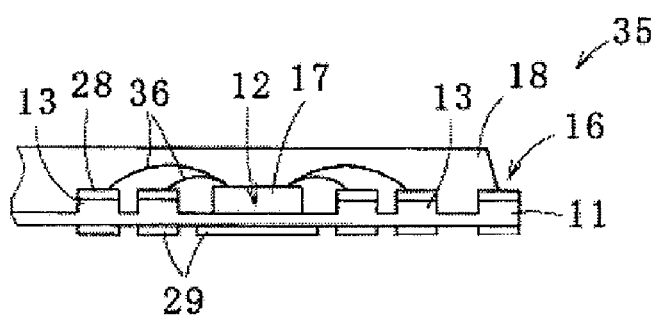
FIG. 6A is an explanatory diagram of a manufacturing method of the intermediate product of the semiconductor device according to one embodiment of the invention.

As shown in FIG. 6A, the semiconductor element 17 is mounted in the semiconductor element mounting region 12 surrounded by the plural upper side terminal parts 13, and wiring (wire bonding) is carried out by the bonding wires 36, and the semiconductor element 17 is electrically connected to the upper side terminal parts 13 through the plated layer 28, and a region including a portion (inside region) of the outer frame 16 and the circuit pattern group 15 in which the semiconductor element 17 is mounted is enclosed with the resin 18 from the upper surface side, and the intermediate product 35 of the semiconductor device is formed.

At this time, the recesses 27, the inner projections 26 and the inner corner regions 22 to 25 to which the lead frame material 11 is exposed to the inside side surface are disposed in the outer frame 16, so that properties of adhesion between the resin 18 and the lead frame 10 are enhanced.

Figure 6B:
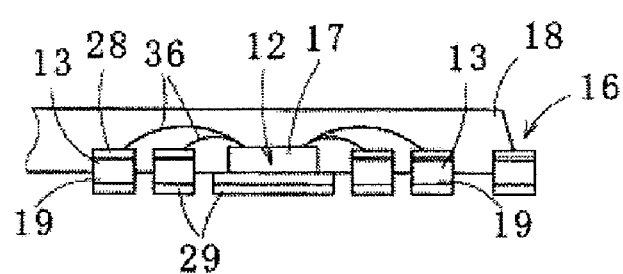
FIGS. 6B and 6C are explanatory diagrams of the manufacturing method of the semiconductor device.
Figure 6C:
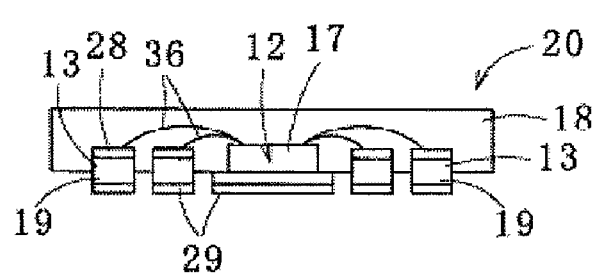

Then, as shown in FIGS. 6B and 6C, the lower surface side of the intermediate product 35 of the semiconductor device is etched (the second etching) using the plated layer 29 as an etching mask, and the semiconductor element mounting region 12 and the lower side terminal parts 19 joined to a lower portion of the upper side terminal parts 13 are projected and are made independent.

Further, portions between each of the unit lead frames 14 and the outer frame 16 and between each of the adjacent unit lead frames 14 are cut and separated by a dicer which is one example of a blade, and the individual semiconductor devices 20 are manufactured. In addition, the one semiconductor device 20 is manufactured per one unit lead frame 14.

The embodiment of the invention has been described above, but the invention is not limited to the embodiment described above and all changes etc. of conditions without departing from the gist are the scope of the invention.

Figure 7A:
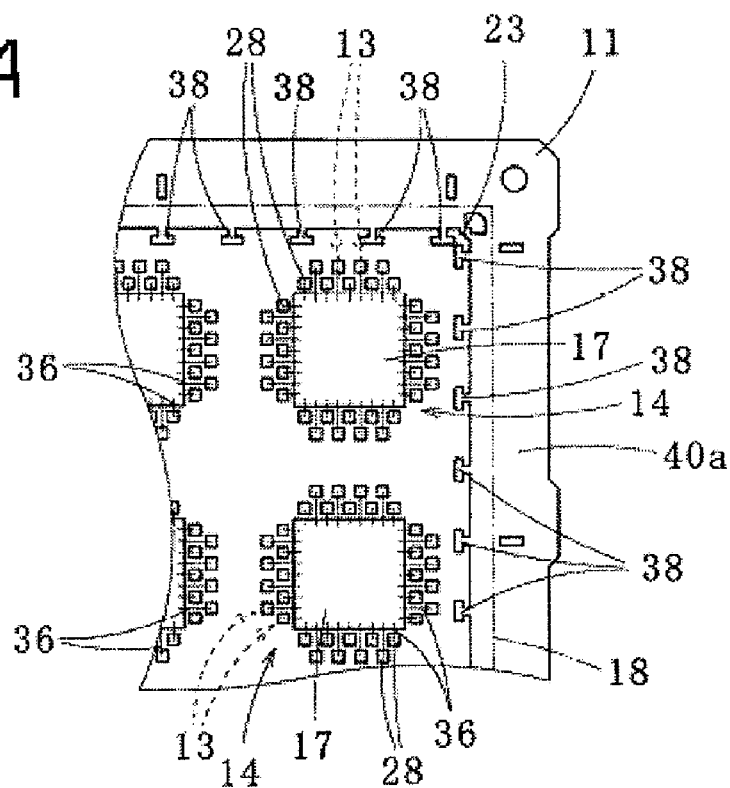
FIGS. 7A and 7B are explanatory diagrams showing modified examples of the intermediate product of the semiconductor device according to one embodiment of the invention.
Figure 7B:
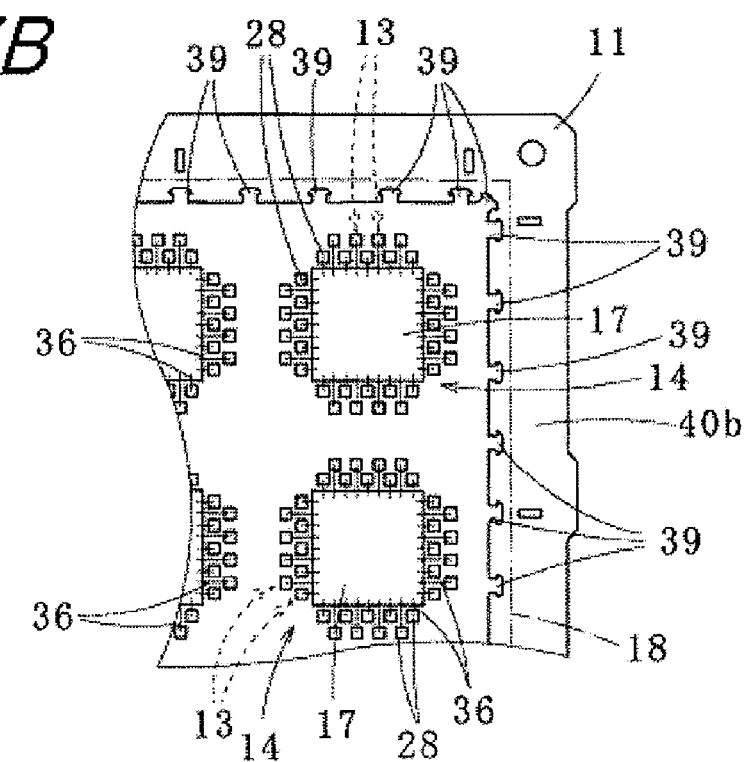

For example, it is not limited to formation of the outer frame by alternately disposing the inner projections and the recesses, and the inner projections or the recesses may be disposed continuously and as shown in FIG. 7A, an outer frame 40a in which only inner projections 38 are disposed can be formed or as shown in FIG. 7B, an outer frame 40b in which only recesses 39 are disposed can be formed.

Also, instead of disposing the stepwise inner corner regions in four corners of the inner edge of the outer frame, the inner projections may be disposed or the recesses 39 may be disposed as shown in FIG. 7B.

Then, the inner projections and the recesses can also be formed in other shapes, for example, an arrow shape rather than the T shape in plan view.

Further, the unit lead frames can be arranged in the circuit pattern group by one line.

Then, as raw materials of plating, Ni, Pd, Au and Sn are given as an example, but other raw materials having resistance to etching can be used.

What is claimed is:

1. A lead frame adapted for manufacturing a semiconductor device comprising:
    a lead frame material;
    a circuit pattern group formed in the lead frame material including unit lead frames arrayed in one line or plural lines, each unit lead frame including a semiconductor element mounting region and plural upper side terminal parts formed in a periphery of the semiconductor element mounting region; and
    an outer frame formed in the lead frame material so as to surround said circuit pattern group with a gap,
    wherein an inner edge of the outer frame is provided with an uneven portion in plan view.

2. A lead frame according to claim 1, wherein the lead frame is used for mounting semiconductor elements in the unit lead frames,
   carrying out wiring on the unit lead frames and the semiconductor elements,
   enclosing the entire surface of the circuit pattern group in which the semiconductor elements are mounted and a part of the outer frame with a resin from an upper surface side, and
   etching from a lower surface side to form lower side terminal parts joined to the upper side terminal parts of the circuit pattern group.

3. A lead frame according to claim 1, wherein the uneven portion formed in the outer frame includes a T-shaped inner projection extended toward the circuit pattern group.

4. A lead frame according to claim 1, wherein the uneven portion formed in the outer frame includes a T-shaped recess formed toward the outside.

5. A lead frame according to claim 1, wherein an inner corner of the outer frame also has an uneven portion in plan view.

6. A lead frame according to claim 4, wherein the uneven portion formed in the inner corner is formed in a stepwise shape in plan view.

7. An intermediate product of a semiconductor device comprising:
   a lead frame material;
   a circuit pattern group formed in the lead frame material including unit lead frames arrayed in one line or plural lines, each unit lead frame including a semiconductor element mounting region and plural upper side terminal parts formed in a periphery of the semiconductor element mounting region; and
   an outer frame formed in the lead frame material so as to surround said circuit pattern group with a gap,
   semiconductor elements mounted on the semiconductor element mounting regions and wired in the unit lead frames,
   a resin enclosing the entire surface of the circuit pattern group in which the semiconductor elements are mounted and a part of the outer frame on an upper surface side of the lead frame lead frame material, and
   lower side terminal parts formed by etching from a lower surface side of the lead frame material so as to be joined to the upper side terminal parts of the circuit pattern group,
   wherein an inner edge of the outer frame is formed in an uneven portion in plan view.

8. An intermediate product of a semiconductor device according to claim 7, wherein the uneven portion formed in the outer frame includes a T-shaped inner projection extended toward the circuit pattern group.

9. An intermediate product of a semiconductor device according to claim 7, wherein the uneven portion formed in the outer frame includes a T-shaped recess formed toward the outside.

10. An intermediate product of a semiconductor device as in claim 7, wherein an inner corner of the outer frame also has an uneven portion in plan view.

11. An intermediate product of a semiconductor device according to claim 10, wherein the uneven portion formed in the inner corner is formed in a stepwise shape in plan view.

* * * * *